United States Patent [19]
Tietz et al.

[11] Patent Number: 5,884,412
[45] Date of Patent: Mar. 23, 1999

[54] METHOD AND APPARATUS FOR PURGING THE BACK SIDE OF A SUBSTRATE DURING CHEMICAL VAPOR PROCESSING

[75] Inventors: James V. Tietz, Fremont; Benjamin Bierman, Milpitas; David S. Ballance, Cupertino, all of Calif.

[73] Assignee: Applied Materials, Inc., Santa Clara, Calif.

[21] Appl. No.: 687,166

[22] Filed: Jul. 24, 1996

[51] Int. Cl.⁶ .................................................. F26B 11/18
[52] U.S. Cl. ................... 34/58; 34/314; 34/317
[58] Field of Search ............................. 34/58, 314, 317

[56] References Cited

U.S. PATENT DOCUMENTS

| | | | |
|---|---|---|---|
| 4,651,440 | 3/1987 | Karl ............................................ | 34/58 |
| 4,677,758 | 7/1987 | Aigo ............................................ | 34/58 |
| 4,790,262 | 12/1988 | Makayama et al. . | |
| 4,900,374 | 2/1990 | Keeley et al. . | |
| 4,989,345 | 2/1991 | Gill, Jr. ...................................... | 34/58 |
| 4,990,374 | 2/1991 | Keeley et al. . | |
| 5,133,284 | 7/1992 | Thomas et al. . | |
| 5,230,741 | 7/1993 | van de Ven et al. . | |
| 5,238,499 | 8/1993 | van de Ven et al. . | |

FOREIGN PATENT DOCUMENTS

| | | |
|---|---|---|
| 0 456 372 A1 | 11/1991 | European Pat. Off. . |
| 0 467 623 A2 | 1/1992 | European Pat. Off. . |
| 0 467 624 A1 | 1/1992 | European Pat. Off. . |
| 0 708 477 A1 | 4/1996 | European Pat. Off. . |
| 0 718 610 A1 | 6/1996 | European Pat. Off. . |
| 40 35 951 C1 | 6/1991 | Germany . |
| 52-149064 A | 12/1977 | Japan . |
| 2 181 458 | 4/1997 | United Kingdom . |
| WO 93/13241 | 7/1993 | WIPO . |

*Primary Examiner*—Ronald Capossela
*Attorney, Agent, or Firm*—Eric Prahl

[57] ABSTRACT

A method of processing a disk-shaped substrate, or wafer, during a chemical vapor process includes a backside purge of the substrate with a purge gas. The backside purge is obtained by spinning the substrate about a central axis, directing a flow of the purge gas over the backside of the spinning substrate, and causing the purge gas to flow in an outward radial direction with the spinning substrate. An apparatus in a vapor processing system structured for conducting the backside purge includes a support mechanism structured and arranged to support the substrate and spin the substrate about a central axis, and a conduit coupled to a source of purge gas, structured and arranged to direct a flow of the purge gas over a backside of the substrate while the substrate is spinning such that the spinning substrate causes the purge gas to flow radially outward.

24 Claims, 5 Drawing Sheets

METHOD AND APPARATUS FOR PURGING THE BACK SIDE OF A SUBSTRATE DURING CHEMICAL VAPOR PROCESSING

CROSS REFERENCE TO RELATED APPLICATION

This application is related to co-owned application entitled "Novel Way of Introducing Gas into an RTP Chamber", by James Tietz et al., Attorney Docket No. 1043/RTP/LE, filed on an even date herewith, and incorporated herein by reference.

BACKGROUND OF THE INVENTION

The invention relates to chemical vapor deposition systems.

Chemical vapor processes for thin film fabrication pass a vapor over a substrate to either grow a film on the substrate, etch the substrate, or otherwise react with a material on the substrate to change the character of the substrate surface. For example, in a chemical vapor deposition (CVD) process for fabricating semiconductor devices, a flow of a reactive vapor is directed to an exposed side of a disk-shaped semiconductor wafer. The wafer is sometimes supported around the periphery of its bottom side on an annular-shaped ledge of an edge ring. The wafer's peripheral edge is left exposed. The substrate is sometimes rapidly heated to facilitate or speed the vapor processing, for example, in rapid thermal chemical vapor deposition (RTCVD) processes, rapid thermal oxidation processes (RTO), and rapid thermal nitridation (RTN) processes.

In such a system, the reactive gases can spill over the edge of the wafer and edge ring, depositing a non-uniform film on the peripheral edge of the wafer and on its backside. Non-uniform depositions on the edge or backside of the wafer can flake off and thereby generate particles that contaminate the process chamber. Also, non-uniform depositions are undesirable for subsequent wafer processing.

One approach to inhibit the process gases from depositing on the edge or backside is to use an edge ring that covers a portion of the upper surface of the wafer. Another approach is to coat the entire backside uniformly to produce a more stable film less likely to flake. To this end, the wafer is supported on pins so that the process gases can easily deposit on the backside. In those cases where depositing on the backside is undesirable, one or another of a variety of edge-specific purges with inert gases are used to prevent reactive gases from reaching the edge and backside areas. One type of such a system uses a susceptor with built-in channels for directing purge gas flows to the edge of the wafer.

Current schemes for providing effective edge purging may incompletely isolate the backside from reactive gases if the flow of purge gas is too weak. If the purge gas is flowed more strongly, it can spill over the front side of the wafer and mix with the process gas at the periphery of the wafer by diffusion or by convection. The resulting dilution of reactive gases over the front side of the wafer leads to incomplete film deposition near the periphery of the front side, thereby reducing the usable area having a uniform film on the wafer.

SUMMARY OF THE INVENTION

The invention provides a method and apparatus for purging a backside of a substantially disk-shaped substrate, or wafer, during a vapor process. The method includes the steps of spinning the substrate about a central axis, supplying a flow of an inert purge gas through an aperture, or nozzle, to the back side of the spinning substrate, and impelling the flow of purge gas in an outward radial direction with the spinning substrate. The purging can be conducted during a chemical vapor process in which a process gas is flowing onto a front side of the spinning substrate.

According to another feature of the invention, the method includes the step of channeling the radially impelled purge gas through a plurality of apertures that are defined by confronting surfaces of the substrate and an edge ring supporting the substrate. The channeling step can include directing the purge gas in a generally axial direction near a peripheral edge of the substrate.

According to another feature of the invention, the spinning step includes spinning the substrate at a rate of at least approximately 90 rpm.

The apparatus for conducting the backside purge in a chemical vapor processing system includes a support mechanism structured and arranged to support the substrate and spin the substrate about its central axis, and a conduit coupled to a source of purge gas, the conduit being structured and arranged to direct a flow of the purge gas toward the backside of the substrate such that the spinning substrate causes the purge gas to flow radially outward.

According to another feature of the invention, the support mechanism is structured and arranged to spin the substrate at a rotational speed of more than approximately 90 rpm.

The support mechanism includes an edge ring supporting the wafer around its peripheral edge, and a support cylinder supporting the edge ring and coupling it to a rotation apparatus. Other features may be built into either the edge ring or the support cylinder. Such features could include areas for passage of gases outward from the wafer, or ridge or vane structures to impart further momentum to the gas to achieve desired results.

The vapor processing system forms a desired film on the front side of a wafer by flowing reactive gases towards the front and a purge gas to the backside. The wafer and the edge ring are spun about a central axis during the process. Gases impinging on both sides of the wafer are impelled radially outward toward the edge, departing the edge of the wafer at a relatively high flow rate.

The radial flow imparted to both the reactive process and nonreactive purge gases (from the front and back sides of the wafer, respectively) ensures that both gases are swept away from the edge of the wafer with minimal mixing within the circumference of the wafer. Thus, the backside purging is especially effective because the reactants flow away before they can diffuse to the backside. Likewise, the present invention prevents dilution of the reactant on the front of the substrate by the same radial motion of gases, and thereby helps to provide more uniform film profiles, especially near the edge of the wafer.

BRIEF DESCRIPTION OF THE DRAWINGS

In the following detailed description of the invention, the same structures illustrated in different figures are referred to with the same reference numerals.

DETAILED DESCRIPTION OF THE INVENTION

Figure 1:
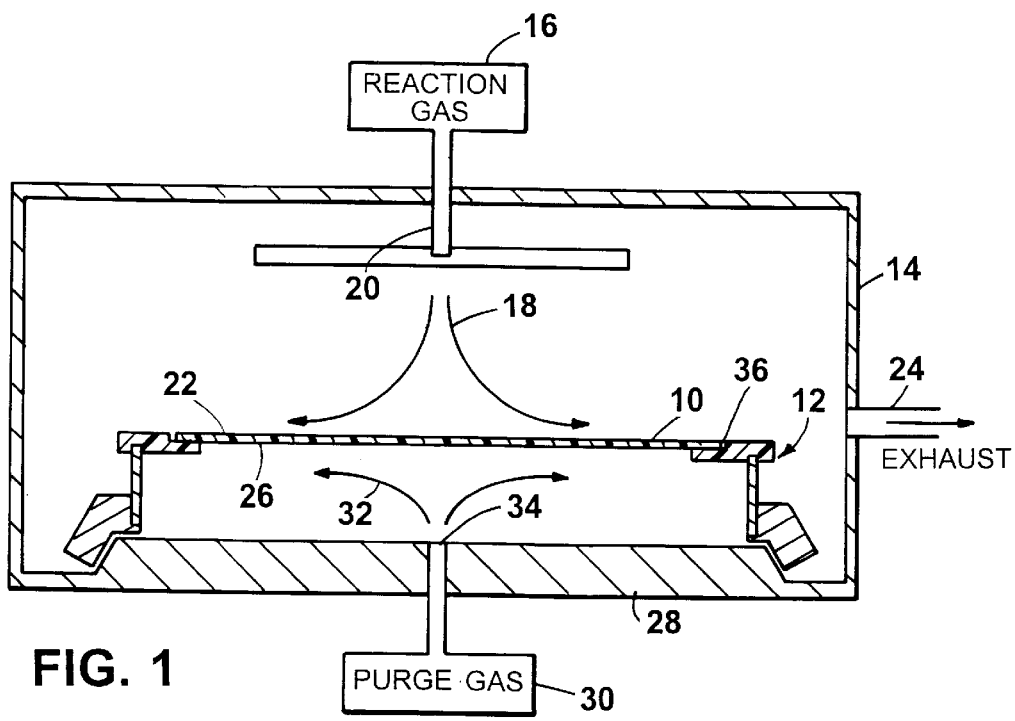
FIG. 1 is a diagrammatic cross-sectional side view of a vapor processing system that uses rotational backside purging.

Referring to FIG. 1, a vapor processing system that purges a backside of a substrate 10 includes a rotatable support structure 12 mounted in a process chamber 14. A reaction gas supply 16 provides a regulated flow of a reaction gas 18 that is directed through apertures formed in a shower-head type nozzle 20 to a front surface 22 of substrate 10. Gases are removed through exhaust 24, which is coupled to a vacuum pump (not shown). The bottom 28 of chamber 14, the support structure 12, and the backside 26 of substrate 10 together define a cavity. A purge gas supply 30 provides a regulated flow of non-reactive purge gas 32 that is directed through an aperture 34 in the bottom 28 of chamber 14 towards the backside 26 of substrate 10.

When the front and back surfaces 22, 26 rotate, they impart an outward radial momentum to the reaction gas 18 and the purge gas 32, respectively. At sufficiently high rotational speeds, the interaction of the substrate surfaces 22, 26 with the gases 18, 32 causes the gases to flow in an outwardly radial direction toward the peripheral edge 36 of substrate 10.

Referring now also to FIGS. 2(a) and (b), the substrate 10 rests on an inner annular ledge 38 of an edge ring 40. In this embodiment, ledge 38 is flat so that when the substrate 10 is resting on it, the flow of purge gas in a gap 41 that necessarily exists between the backside of the substrate and the annular ledge 38 is significantly restricted. This produces a higher velocity of any purge gas which does manage to flow through region 41 thereby also producing a more effective barrier to process gas flowing back through region 41 into the region behind the wafer.

An upper surface 42 of an outer annular portion 44 of the edge ring 40 is approximately level with the upper surface 22 of the substrate 10. Under some circumstances, it may be undesirable to have an upward step or a downward step that could disturb the smooth outward flow of process and purge gases. Also a downward step could allow process gases to interact more easily with the peripheral edge of the substrate. The interaction of the gases 18 and 32 with the rotating substrate upper surface 22 and outer annular portion upper surface 42 transfers additional outward radial momentum to the gases. Both gases 18 and 32 move radially outward and away from the upper surface 22 of the substrate 10.

The outward radial flow inhibits the significant mixing of the purge gas 32 with the reaction gas 18 over the substrate upper surface 22. This helps to achieve a more uniform process profile out to the periphery of the upper surface 22 of the substrate 10. The flowing purge gas 32 prevents the reaction gas 18 from migrating over the peripheral edge 36 of the substrate, and thereby helps to prevent the reaction gas 18 from depositing an unwanted film on the edge 36 or the back surface 26 of the substrate 10.

Figure 3A:
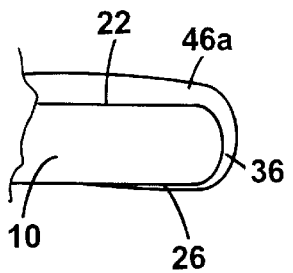
FIGS. 3(a)–(c) schematically illustrate deposition profiles near the peripheral edge of a wafer under different conditions.

A film 46a produced on a wafer substrate 10 without a flow of a purge gas and/or without rotating the wafer 10 is schematically illustrated in FIG. 3(a). The film 46a extends onto the peripheral edge 36 of the wafer 10 and around onto the backside 26. These areas of the film are typically thinner than the film produced on the upper surface 22 of the wafer 10. The film 46a can easily flake off from these regions, thereby contaminating the system with particles.

Figure 3B:
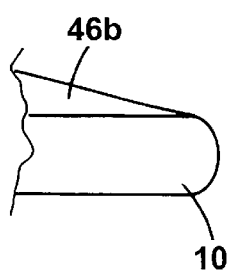

FIG. 3(b) shows a second film 46b produced by flowing purge gas 32 during the deposition, but without rotating the wafer 10 at speeds sufficient to cause an outward radial flow of the purge gas 32 or process gas 18. In this case, the film 46b has a reduced profile, or thickness, near the edge 36 of the wafer 10, thereby reducing the usable area of the upper surface of the wafer.

Figure 3C:
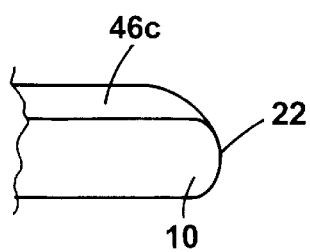

FIG. 3(c) schematically illustrates a third film 46c produced by flowing purge gas 32 during the deposition and by rotating the wafer 10 at speeds sufficient to cause an outward radial flow of the purge gas 32 and process gas 18. Film 46c has a more uniform profile near the edge 36 of the wafer 10, and does not extend around the edge 36.

Figure 4:
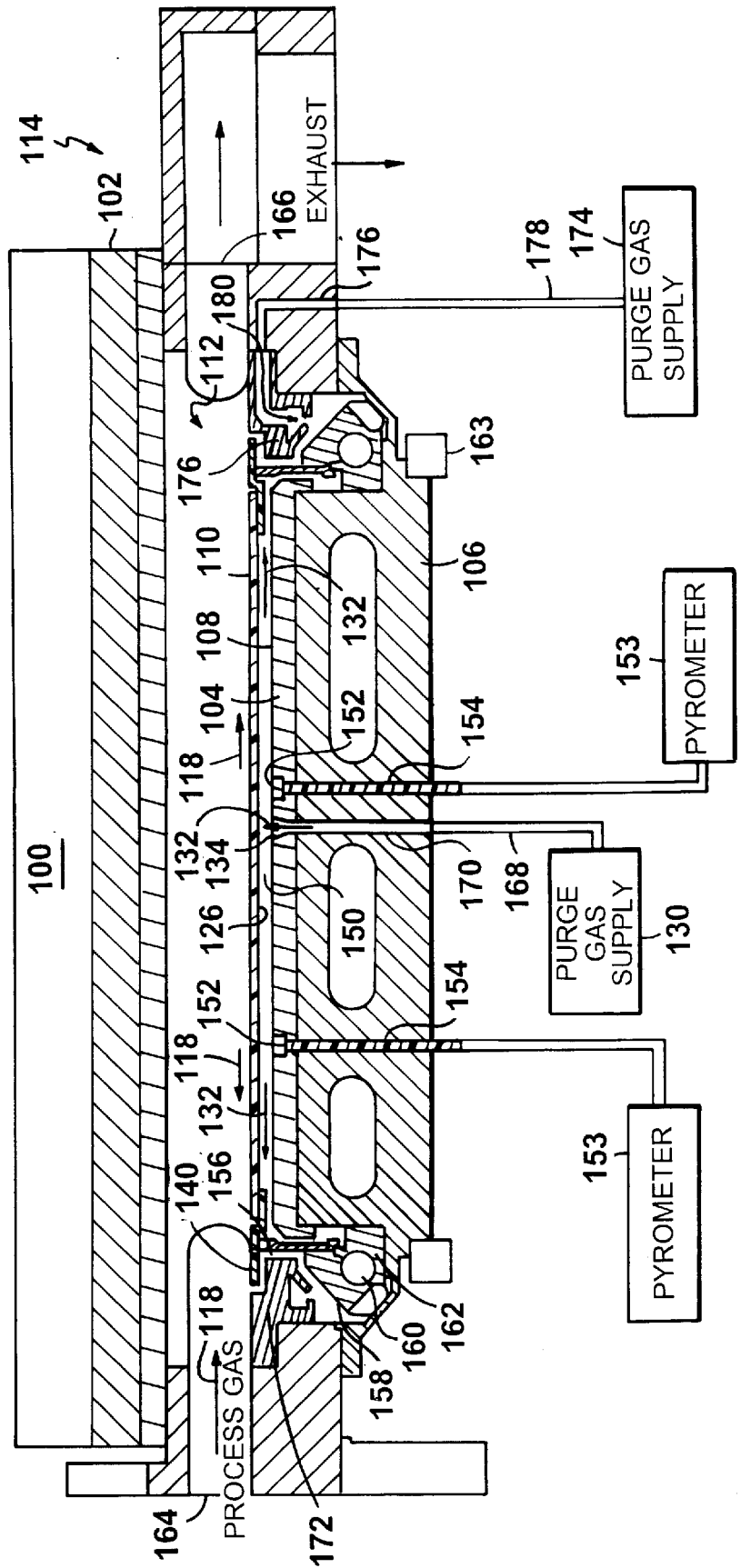
FIG. 4 is a cross-sectional side view of an RTP system embodying of the invention.

A rapid thermal processing (RTP) system that has been modified in accordance with the invention is shown in FIG. 4. The RTP system includes a processing chamber 114 for processing a silicon wafer 110 (e.g. a 200 mm or 300 mm diameter wafer). The wafer 110 is held inside the chamber on a rotatable substrate support structure 112 and can be heated by a heating element 100 located directly above the substrate.

The heating element 100 generates radiation which enters the processing chamber 114 through a water-cooled quartz window assembly 102 which is approximately one inch (2.5 cm) above the substrate. Beneath substrate 110 is a reflector 104 which is mounted on a water-cooled, stainless steel base 106. Reflector 104 is made of aluminum and has a highly reflective surface coating 108. The backside 126 of wafer 110 and the top of reflector 104 form a reflecting cavity for enhancing the effective thermal emissivity of the wafer 110.

Support structure 112 includes an edge ring 140 which contacts the wafer 110 around the wafer's outer perimeter, thereby exposing all of the backside 126 of the wafer 110 except for a small annular region about the outer perimeter. Edge ring 140 has a radial width of approximately one inch (2.5 cm). To minimize the thermal discontinuities that will occur at the edge of wafer 110 during processing, edge ring 140 is made of the same, or similar, material as the wafer, e.g. silicon or silicon carbide coated with silicon.

Edge ring 140 rests on a rotatable tubular quartz cylinder 156 that is coated with silicon to render it opaque in a frequency range of pyrometers 153 that measure the temperature profile of backside 126. The silicon coating on the quartz cylinder 156 acts as a baffle to block out radiation from external sources that might contaminate the measurements. The bottom of the quartz cylinder 156 is held by an annular upper bearing race 158 which rests on a plurality of ball bearings 160 that are, in turn, held within a stationary, annular, lower bearing race 162. The ball bearings 160 are made of steel and coated with silicon nitride (or alternatively, solid silicon nitride) to reduce particulate formation during operation. Upper bearing race 158 is magnetically-coupled to an actuator (not shown) positioned on the outside of the chamber, which rotates cylinder 156, edge ring 140 and substrate 110 at speeds of at least approximately 90 rpm and as high as 1500 rpm or more.

Note that we have observed an effect (i.e., impelling purge gas in an outward radial direction) with rotation speeds as low as 20 rpm and positive results are produced with rotation speeds of 30–40 rpm.

A process gas 118 is introduced into the space between the substrate 110 and window assembly 102 through a side port 164. In other embodiments, process gas 118 passes into chamber through apertures (not shown) formed in window assembly 102 (described in the afore-mentioned co-owned patent application entitled "Novel Way of Introducing Gas into an RTP Chamber"), or though a shower head type of nozzle 20 (see FIG. 1) centrally positioned above wafer 10, such that process gas 118 is directed towards a frontside 188 of wafer 110. Gases are removed through exhaust port 166, which may be coupled to a vacuum pump (not shown).

A nozzle 134 that is approximately centered in reflector 104 directs a flow of a purge gas 132 to a central area of the back surface 126 of substrate 110. Nozzle 134 is coupled to a regulated supply 130 of purge gas 132 via tube 168 and channel 170 in base 106. Nozzle 134 directs purge gas, on average, approximately normal to the surface 126. In another embodiment, nozzle 134 can be structured to direct purge gas 132 upward and radially outward in a conical-shaped flow pattern. Of course, it should be understood that other methods for introducing this backside purge gas in a way that is compatible with this invention are readily implemented by persons skilled in the art.

An optional purge ring 172 is fitted into the chamber body and surrounds the quartz cylinder 156. Purge ring 172 has an internal annular cavity which opens up to a region above upper bearing race 158. The internal cavity is connected to a second regulated purge gas supply 174 through a passageway 176 and tubing 178. During processing, a second flow of purge gas 180 enters into the chamber through purge ring 172.

Alternatively, cylinder 156 can be structured to form passages for purge gas 132 to flow out of cavity 150 into the annular region between edge ring 138, cylinder 156 and purge ring 172.

Temperature probes 152 (only two of which are shown in FIG. 4) measure the temperatures at localized regions 122 of substrate 110. The temperature probes are sapphire light pipes that pass through conduits 154 that extend from the backside of base 106 through the top of reflector 104. Although only two measurement probes 152 are shown in FIG. 4, the described embodiment actually uses eight measurement probes distributed over the reflector 104 so as to measure the temperature at different radii of the substrate 110.

During thermal processing steps, support structure 104 is rotated. Thus, each probe 152 actually samples the temperature profile of a corresponding annular ring area on the substrate 110.

Figure 6:
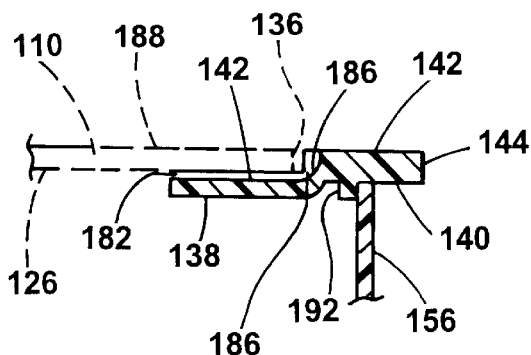
FIG. 6 is a sectional view through lines 6—6 of FIG. 5, with a substrate shown in shadow.
Figure 5:
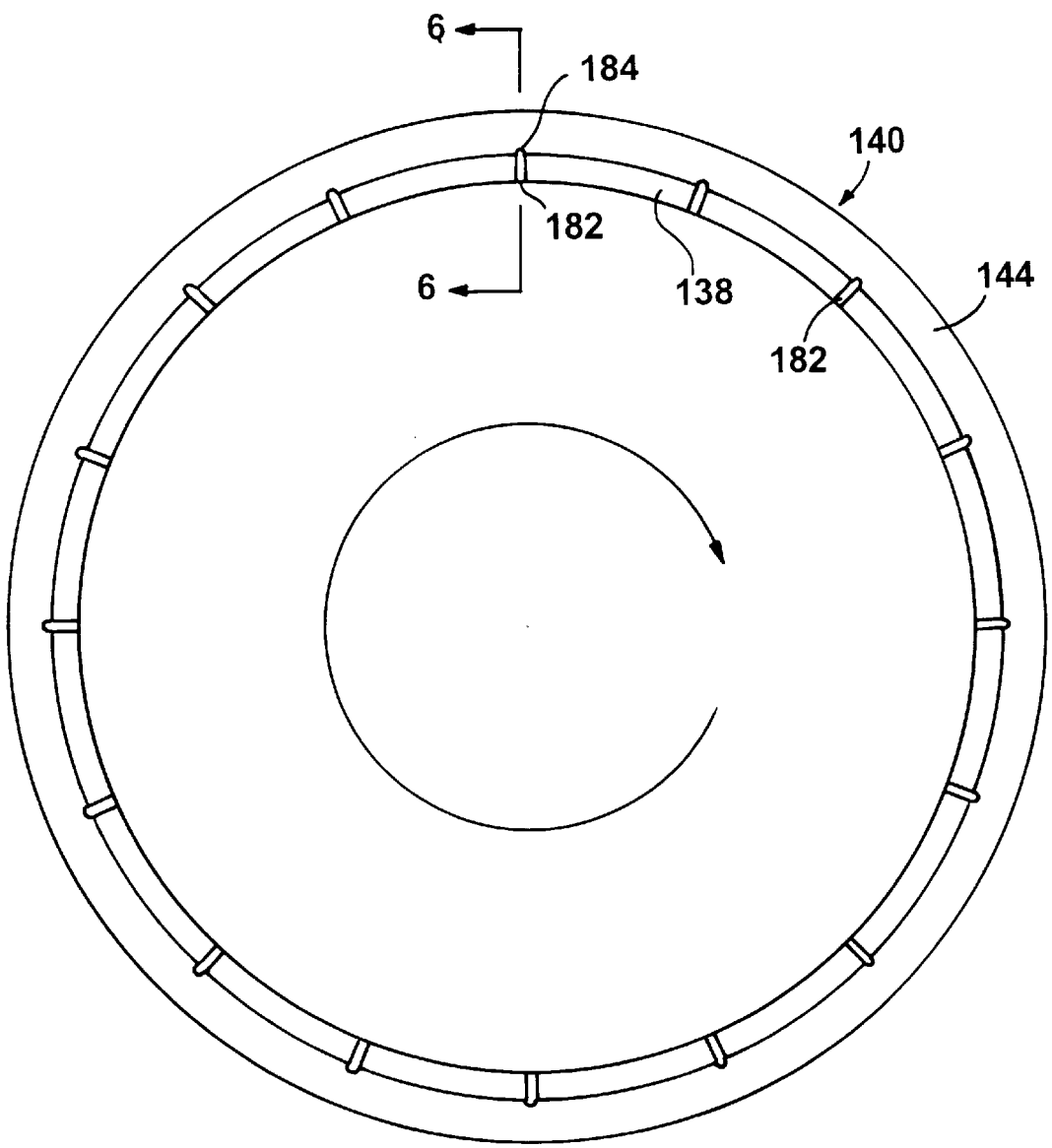
FIG. 5 is a plan view of an edge ring.

Referring now to FIGS. 5 and 6, edge ring 140 has an inner portion forming a ledge 138 that supports substrate 110 and an outer portion 144 that is supported by cylinder 156. In the above-described embodiment, the surface of ledge 138 is flat so as to create a good seal when contacted by the backside of the wafer. In this alternative embodiment, however, grooves 182 are formed in the upper surface 142 of ledge 138. The grooves extend in an approximately radial direction from the inner edge of the ledge 138, partially into the outer portion 144. The grooves 182 provide flow paths that allow the purge gas 132 to more easily flow between the substrate 110 and the supporting ledge 138 of edge ring 140. The outermost portions of grooves 182 include an arcuate upward bend 186 that redirects the flow of purge gas 132 past the peripheral edge 136 of substrate 110 upward and outward in a more axial direction.

While only sixteen grooves 182 are illustrated in FIG. 5, a greater number of grooves more closely spaced together around the ring may provide a more uniform outward radial flow of purge gas.

The upper surface 142 at the outer portion 144 of edge ring 140 is at an elevation approximately the same as the upper surface 188 of substrate 110.

Figure 8:
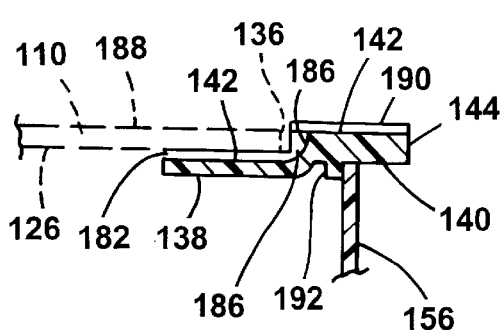
FIG. 8 is a sectional view through lines 8—8 of FIG. 7, with a substrate shown in shadow.
Figure 7:
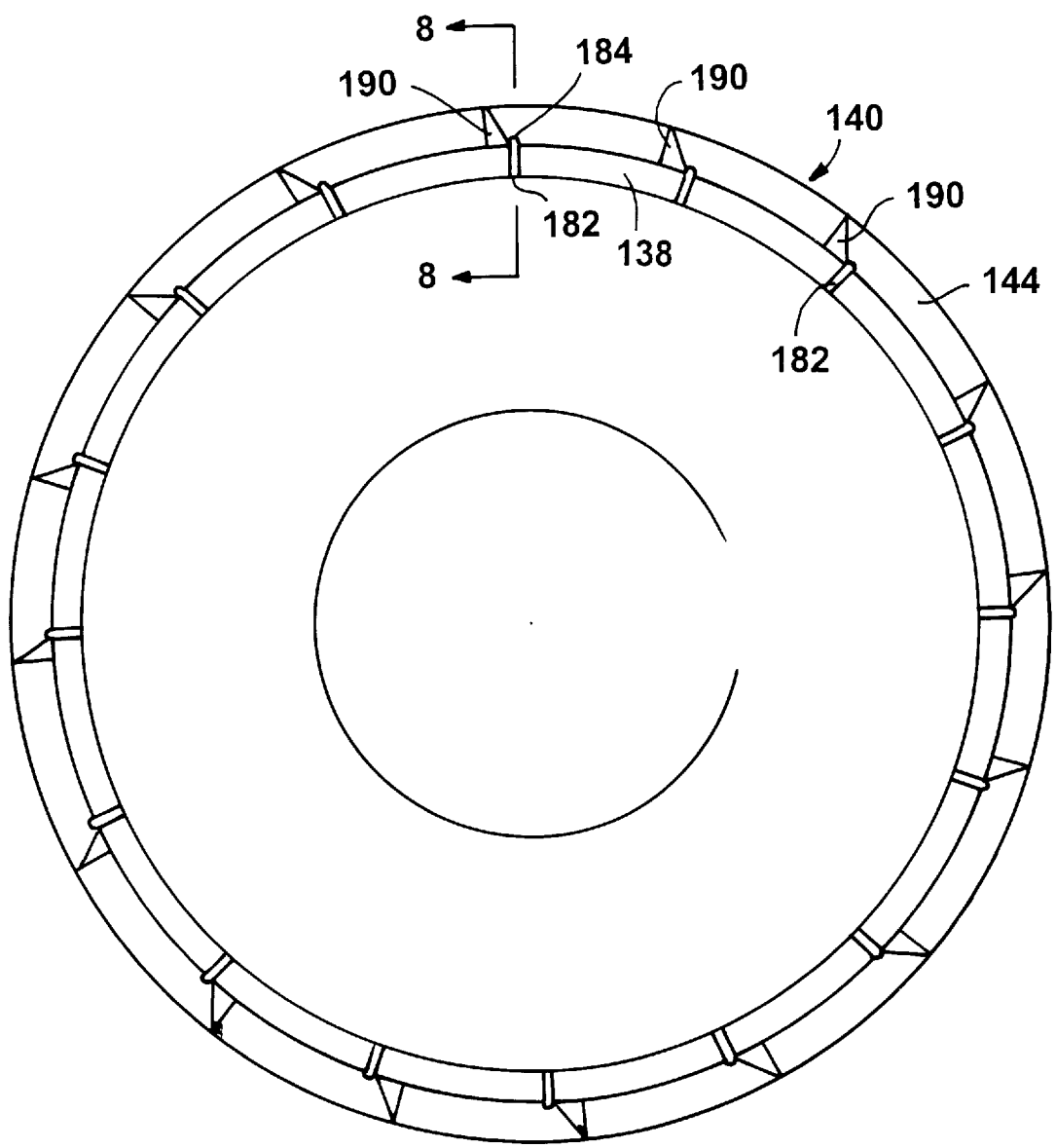
FIG. 7 is a plan view of another embodiment of an edge ring.

In another embodiment, illustrated in FIGS. 7 and 8, the upper surface 142 includes ridges or vanes 190 structured to assist in moving the purge gas 132 and the process gas 118 outward and away from the edge ring 140.

The edge ring 140 is also designed to create a light-tight seal with the quartz cylinder 156. Extending from the bottom surface of the edge ring 140 is a cylindrically shaped lip 192 which has an outside diameter that is slightly smaller than the inside diameter of the quartz cylinder 156, so that it fits into the cylinder, as shown, and forms a light seal. Alternatively, lip 192 can be a larger diameter to form a light seal with the outer surface of cylinder 156.

Edge ring 140 has an outer radius that is larger than the radius of the quartz cylinder 156 so that it extends out beyond the quartz cylinder. The annular extension of the edge ring 140 beyond cylinder 156, in cooperation with purge ring 172 located below it, functions as a baffle which prevents stray light from entering the reflecting cavity 150 at the backside of the substrate. To further reduce the possibility of stray light reflecting into the reflecting cavity, edge ring 140 and purge ring 145 may also be coated with a material that absorbs the radiation generated by heating element 110 (e.g., a black or grey material).

In the described embodiment, the purge gas is an inert gas, e.g. argon, although other types of gases can also be used. The choice of gas depends upon the particular material used in the chamber and upon the process being performed in the chamber. For example, under other circumstances it may be desirable to use a purge gas that will react with the source gas to scavenge possible deposition material, e.g. $H_2$ or HCl.

In other embodiments, the purge gas 132 can be directed towards the backside of the substrate through multiple injection ports. The purge gas need not be directed near the center of the substrate, and the flow rates through the multiple injection ports do not need to be the same. The injection ports can also direct the purge gas at an angle to the substrate backside. It will be understood that, in general, regardless of the details of the manner in which the purge gas is introduced to the backside, the rotating substrate provides a pumping action that will pull the purge gas radially outward.

Figure 9:
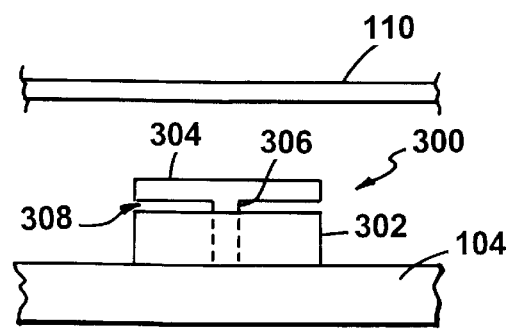
FIG. 9 is another embodiment of a nozzle for introducing the purge gas into the cavity behind the substrate.

A particularly effective injector 300 for introducing the purge gas is shown in FIG. 9. The injector 300 extends up from the reflector plate 104 and includes a hollow cylindrical body 302 and a top plate 304 mounted on a post 306 that passes through the center of the cylindrical body 302. The top plate 304 is positioned above the cylindrical body so as to form a slit 308 which extends 360° around the periphery of the nozzle. Purge gas, which is introduced into the hollow portion of the cylindrical body from below, flows up through the injector and out of the slit 308. This produces a flow of purge gas that is substantially horizontal or parallel to the backside of the spinning substrate 110.

In a system for processing 300 mm wafers in which the backside of the wafer is 18 mm above the reflector plate 104, the injector 300 is 0.75 inch in diameter and 10 mm high.

The slit is about 15 mils wide and is about 7 mm above the reflector plate 104. For such a structure, an appropriate gas flow rate might be about 5 liters/min of $H_2$, depending of course on other process and system variables. The injector can be made of quartz or a gold plated metal (e.g. aluminum or stainless steel).

In the described embodiment, the injector 300 is located slightly away from the center of the reflector plate 104. The precise location depends on design features of the system. Some of the considerations for optimum placement of the injector in a multiple lamp RTP system, such as was described earlier, are the following. Since the presence of the injector perturbs the temperature profile of the wafer in the vicinity of where the injector is located, it is desirable to move the injector out towards the periphery of the spinning wafer. In that way, its net impact on any single location of the wafer is reduced because the outer regions of the spinning wafer are heated by multiple lamps of the heating element and any given location near the periphery does not feel the impact of the injector except for a small part of the rotational cycle. However, the further one moves the injector out towards the periphery of the wafer the more asymmetric becomes the flow of gas relative to the backside of the spinning wafer. To achieve a more asymmetric flow, which is of course desirable, the injector should be closer to the center, where it produces a greater impact on the temperature profile. Thus, the optimum location is determined by balancing these two competing effects, and it will tend to be close to but not at the center.

With regard to the height of the injector, it is desirable to position the slit as close to the backside of the spinning wafer as possible so as to get effective flow of purge gas against the spinning wafer. However, if the top of the injector is too close to the wafer, the region between the top of the injector and the backside of the wafer will tend to entrap gas or negatively impact the flow of purge gas in this region. Thus, the optimum height of the injector is determined by balancing these two competing effects.

Though we have shown nozzle 300 in an RTP system, it should be understood that it could also be used in any system in which the backside purge technique described herein would be useful.

Also note that the process and purge gases may be removed from the chamber through multiple exhaust ports, which may be distributed around the support structure.

Although the invention is especially useful in semiconductor fabrication processes in which the substrate is typically a disk-shaped semiconductor, we intend the term "substrate" to broadly cover any object that is being processed in a vapor process chamber. The term "substrate" includes, for example, semiconductor wafers, flat panel displays, glass plates or disks, and plastic work pieces.

In addition, the term "vapor processing system" is intended to broadly cover any process by which a surface of a substrate is altered by flowing a process gas over the surface. This can include CVD systems, RTCVD systems, RTO systems, RTN systems, and other vapor processing systems that are currently known or that may be developed.

Figure 2:
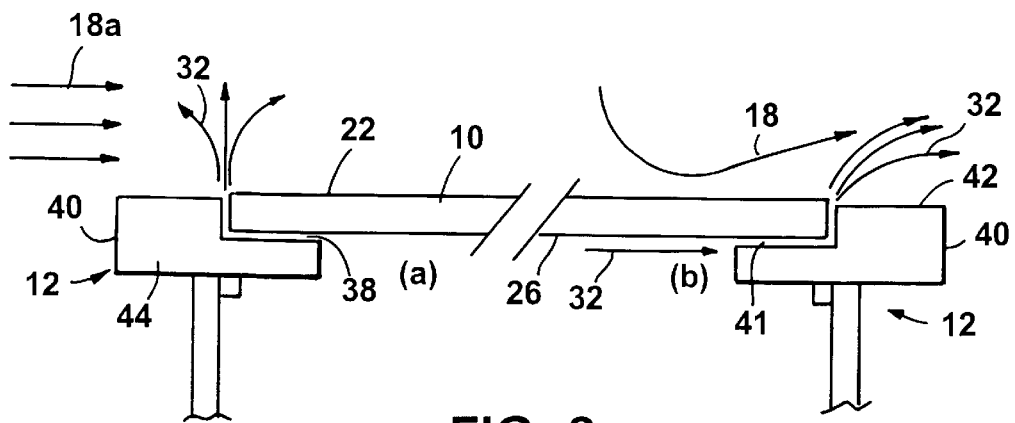
FIGS. 2(a) and (b) are partial diagrammatic cross-sectional side views of a substrate and support structure showing gas flow patterns (a) when there is no reaction gas flow and the substrate is not rotated, and (b) when a reaction gas is directed towards the front side of the substrate and the substrate is rotated.

Though we have described the system as including a front side gas injection system which uses a showerhead and produces radially symmetric gas flow, the invention also works in the case of side injection system which produces a gas flow as indicated by the arrows 18a in FIG. 2.

Other embodiments are within the scope of the invention.

What is claimed is:

1. An apparatus in a vapor processing system which includes a process chamber, the apparatus comprising:

a rotatable support assembly structured and arranged to support a disk-shaped substrate within the process chamber;

a motor which during operation spins the support assembly and the substrate about a central axis; and a conduit structured and arranged to direct a flow of purge gas over a backside of the substrate while the substrate is rotating such that the rotating substrate urges the purge gas to flow radially outward.

2. The apparatus of claim 1, wherein the support assembly is capable of spinning the substrate at a rotational speed of at least approximately 90 rpm.

3. The apparatus of claim 1, further comprising a process gas conduit structured and arranged to direct a flow of process gas over a frontside of the substrate while the substrate is spinning.

4. The apparatus of claim 1, wherein the support assembly includes an edge ring which during use supports the substrate, the edge ring having a surface which confronts the backside of the substrate and which has channels arranged to channel the radially flowing purge gas around a peripheral edge of the substrate.

5. A system to vapor process a disk-shaped substrate, comprising:

a process chamber;

an edge ring to support the substrate within the process chamber;

a rotation assembly structured and arranged to spin the edge ring and the substrate thereby during vapor processing;

a process gas conduit structured and arranged to direct a flow of process gas over a frontside of the substrate; and a purge gas conduit structured and arranged to direct a flow of purge gas over a backside of the substrate while the substrate is spinning.

6. The processing system of claim 5, further comprising a heat source positioned above the substrate for thermal processing the substrate.

7. The processing system of claim 6, wherein the bottom of the process chamber, the rotation assembly, and the backside of the substrate cooperatively form a thermal cavity.

8. The processing system of claim 5, wherein the rotation assembly includes a cylinder supporting the edge ring, an annular upper bearing race supporting the cylinder, a stationary lower bearing race, and bearings between the upper and lower bearing races and enabling the upper bearing race to rotate relative to the lower bearing race.

9. The processing system of claim 5, wherein the rotation assembly is structured and arranged to rotate the substrate about a central axis at a rotational speed of at least approximately 90 rpm.

10. The processing system of claim 5, wherein the edge ring includes an annular ledge having an upper surface to support the backside of the substrate near a peripheral edge of the substrate, the ledge being structured and arranged to allow passage of outwardly flowing purge gas past the peripheral edge.

11. The processing system of claim 5 wherein the process gas conduit comprises an injector which includes a slit through which the purge gas flows and wherein the slit is disposed parallel to a plane defined by the substrate when said substrate is supported by said edge ring.

12. A method of purging a backside of a disk-shaped substrate with a purge gas, comprising:

spinning the substrate about a central axis of the substrate;

while the substrate is spinning, flowing the purge gas over the backside of the spinning substrate, whereby the spinning motion of the substrate urges the purge gas to flow in an outward radial direction.

13. The method of claim 12, further comprising flowing a process gas over a frontside of the spinning substrate while also flowing the purge gas over the backside of the substrate.

14. The method of claim 13, wherein the step of flowing the purge gas comprises flowing an inert gas.

15. The method of claim 13, further comprising channelling the radially flowing purge gas past a peripheral edge of the spinning substrate.

16. The method of claim 13, wherein flowing the purge gas comprises flowing the purge gas through an aperture in a plate spaced from the backside of the substrate.

17. The method of claim 13, further comprising the step of heating the substrate while flowing the process gas.

18. The method of claim 12, wherein the spinning step includes spinning the substrate at a rotational speed of at least approximately 90 rpm.

19. The method of claim 15, wherein the channelling step includes channelling the radially flowing purge gas through a plurality of flow paths that are defined by confronting surfaces of the disk-shaped substrate and an edge ring supporting the disk-shaped substrate.

20. The method of claim 19, wherein the step of channelling comprises directing the radially flowing purge gas in a generally axial direction near a peripheral edge of the disk-shaped substrate.

21. The method of claim 15, wherein the spinning step includes spinning the substrate on a rotating edge ring, an outer annular surface of the edge ring further urging the channeled purge gas and the outwardly flowing process gas to flow radially outward therefrom.

22. A method of vapor processing a disk-shaped substrate in a process chamber, comprising the steps of:

supporting the substrate on a rotation assembly, the rotation assembly including an edge ring having an inner annular ledge supporting the substrate near the substrate's peripheral edge;

spinning the rotation assembly and the substrate about a rotational axis of the substrate;

while spinning the substrate, flowing a purge gas over a backside of the substrate;

while flowing a purge gas onto the backside, flowing a process gas over a frontside of the substrate, wherein the spinning of the substrate urges the purge gas radially outward toward the peripheral edge.

23. The method of claim 22, further including the step of heating the substrate while spinning the substrate.

24. The method of claim 22, wherein the spinning step includes spinning the substrate at a rotational speed of at least approximately 90 rpm.

* * * * *